United States Patent
Park et al.

(10) Patent No.: US 7,265,818 B2
(45) Date of Patent: Sep. 4, 2007

(54) METHOD OF EXPOSING A WAFER TO A LIGHT, AND RETICLE, RETICLE ASSEMBLY AND EXPOSING APPARATUS FOR PERFORMING THE SAME

(75) Inventors: Byong-Cheol Park, Suwon-si (KR); Dong-Hwa Shin, Suwon-si (KR); Seung-Ki Chae, Soul (KR); Sang-Ho Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 228 days.

(21) Appl. No.: 11/023,231

(22) Filed: Dec. 27, 2004

(65) Prior Publication Data

US 2005/0140952 A1 Jun. 30, 2005

(30) Foreign Application Priority Data

Dec. 26, 2003 (KR) ............... 10-2003-0097467

(51) Int. Cl.
 G03B 27/32 (2006.01)
 G03B 27/42 (2006.01)
(52) U.S. Cl. .................. 355/77; 355/53; 430/311
(58) Field of Classification Search ............. 355/53, 355/67–69, 77; 430/5, 20, 22, 30, 311; 250/548; 356/399–401
See application file for complete search history.

(56) References Cited

U.S. PATENT DOCUMENTS

| 5,194,893 A | 3/1993 | Nishi ..................... 355/53 |
| 5,362,583 A | 11/1994 | Nakagawa ................ 430/5 |
| 5,847,813 A | 12/1998 | Hirayanagi ............. 355/75 |
| 6,169,602 B1* | 1/2001 | Taniguchi et al. ........ 356/399 |
| 6,180,289 B1 | 1/2001 | Hirayanagi ............. 430/5 |
| 2003/0138742 A1 | 7/2003 | Irie et al. ............. 430/396 |
| 2004/0189967 A1* | 9/2004 | Ottens et al. ........... 355/67 |

FOREIGN PATENT DOCUMENTS

| JP | 03237459 | 10/1991 |
| JP | 2002-33272 | 1/2002 |
| KR | 2001-0098613 | 11/2001 |

* cited by examiner

Primary Examiner—Henry Hung Nguyen
(74) Attorney, Agent, or Firm—F. Chau & Associates, LLC

(57) ABSTRACT

A method of exposing a wafer to a light comprises transferring an image onto a plurality of shot areas by irradiating a projection light, each of the plurality of shot areas including at least one die area defined on the wafer on which a photoresist film is formed, and scanning the at least one die area adjacent to an edge portion of the wafer by irradiating a scanning light.

15 Claims, 8 Drawing Sheets

METHOD OF EXPOSING A WAFER TO A LIGHT, AND RETICLE, RETICLE ASSEMBLY AND EXPOSING APPARATUS FOR PERFORMING THE SAME

CROSS-REFERENCE TO RELATED APPLICATIONS

This application claims priority to Korean Patent Application No. 2003-97467, filed on Dec. 26, 2003, in the Korean Intellectual Property Office, the disclosure of which is herein incorporated by reference in its entirety.

BACKGROUND

1. Technical Field

The present disclosure relates to an exposing process for manufacturing semiconductor devices; more particularly, a method of exposing a wafer to a light, thereby transferring a pattern on a reticle onto the wafer, and an apparatus for performing the exposing method that includes a reticle assembly.

2. Discussion of Related Art

Generally, semiconductor devices are manufactured by performing a fabrication (FAB) process for forming an electric circuit on a semiconductor substrate, an electrical die sorting (EDS) process for inspecting electrical characteristics of the electric circuit, and a packaging process for separating the semiconductor substrate into individual semiconductor chips and sealing each of the semiconductor chips using, for example, an epoxy resin.

The FAB process includes a deposition process for forming a thin layer on the semiconductor substrate, a chemical mechanical polishing (CMP) process for polishing the thin layer, a photolithography process for forming a photoresist pattern on the thin layer, an etching process for etching the thin layer into an electrical pattern using the photoresist pattern as a mask, an ion implantation process for implanting ions into a region of the semiconductor substrate, a cleaning process for cleaning impurities from the semiconductor substrate, and an inspection process for inspecting a surface of the semiconductor substrate to detect defects in the thin layer or in the electrical pattern.

The photolithography process includes a coating process for coating a photoresist composition layer on a silicon wafer, a baking process for hardening the photoresist composition layer into a photoresist film, an exposing process for transferring a pattern on the reticle (i.e., a reticle pattern) onto the photoresist film, and a developing process for forming the photoresist pattern along the transferred reticle pattern.

An exposure apparatus for performing the exposing process includes a light source, an illumination unit for illuminating the reticle with a light from the light source, a reticle stage for supporting the reticle, a projection optical system for projecting a light passing through the reticle onto the wafer, and a wafer stage for supporting the wafer. Examples of the exposure apparatus are disclosed in U.S. Pat. No. 6,331,885 (issued to Nishi) and U.S. Pat. No. 6,538,719 (issued to Takahashi et al.).

The reticle has a pattern corresponding to an image transferred onto a plurality of shot areas defined on the wafer. The reticle stage is disposed over the projection optical system. The wafer stage is disposed under the projection optical system.

An illumination light is generated from the light source. The reticle is irradiated by the illumination light having passed through the illumination unit during the exposing process. The reticle stage moves horizontally for transforming the illumination light passing through the reticle into a projection light. The projection light contains image information after passing through the reticle. The wafer stage moves in an opposite direction to the reticle stage so that the projection light transfers the image information onto the wafer.

A quantity and a size of the shot areas may be determined in accordance with a characteristic and a usage of the semiconductor device. The exposing process includes a first exposing process performed on the shot areas and a second exposing process performed on edge shot areas. The edge shot areas are adjacent to edge portions of the wafer. The first exposing process may be performed on all the shot areas of the wafer. Alternatively, the first exposing process may be performed on all the shot areas except for the edge shot areas of the wafer. The second exposing process removes the photoresist film on die areas adjacent to the edge portion of the wafer.

In a conventional single exposing process, the first exposing process may use a conventional reticle having a single pattern as an exposure mask. The second exposing process in the conventional single exposing process may use a non-patterned reticle as the exposure mask. In a conventional multiple exposing process, a reticle having a multiple pattern areas may be used as the exposure mask.

In the conventional single exposing process, for performing the second exposing process, the conventional reticle needs to be replaced with the non-patterned reticle after completing the first exposing process. In the conventional multiple exposing process, the number of the shot areas may increase because the pattern area of the reticle in the first exposing process is smaller than that of the conventional reticle.

A need, therefore, exists to improve an exposure method and an exposure apparatus to reduce time loss in the conventional single exposing process and the conventional multiple exposing process.

SUMMARY OF THE INVENTION

In an exemplary embodiment of the present invention, a method of exposing a wafer to a light comprises transferring an image onto a plurality of shot areas by irradiating a projection light, each of the plurality of shot areas including at least one die area defined on the wafer on which a photoresist film is formed, and scanning the at least one die area adjacent to an edge portion of the wafer by irradiating a scanning light.

In another exemplary embodiment of the present invention, a method of exposing a wafer to a light comprises irradiating a reticle having a projection pattern corresponding to an image to be transferred onto the wafer with an illumination light, exposing a plurality of shot areas to a projection light that has passed through the reticle, each of the plurality of shot areas including at least one die area defined on the wafer on which a photoresist film is formed, moving the reticle and a light transmitting member such that the illumination light illuminates the light transmitting member, the light transmitting member being disposed adjacent to the projection pattern and having a projection area, and moving the wafer such that a scanning light that has passed through the light transmitting member scans die areas adjacent to an edge portion of the wafer.

In still another exemplary embodiment of the present invention, a reticle for exposing a wafer to a light comprises a first region including an image pattern irradiated by an illumination light, an image corresponding to the image pattern being transferred on a plurality of shot areas, and each of the plurality of shot areas including at least one die area defined on the wafer on which a photoresist film is formed, and a second region for exposing die areas adjacent to edge portions of the wafer to the illumination light, the second region being disposed adjacent to the first region.

In another exemplary embodiment of the present invention, a reticle assembly for exposing a wafer to a light comprises a reticle including a projection pattern for transferring an image onto a plurality of shot areas using an illumination light, each of the plurality of shot areas including at least one die area defined on the wafer on which a photoresist film is formed, a light transmitting member disposed adjacent to the reticle, the light transmitting member including a light transmitting area for exposing the at least one die area adjacent to an edge portion of the wafer to an illumination light, and a stage for supporting the reticle and the light transmitting member.

In another exemplary embodiment of the present invention, an apparatus for exposing a wafer comprises a light source for generating a light, a reticle including a first region including an image pattern being irradiated by the light, an image corresponding to the image pattern being transferred on a plurality of shot areas including at least one die area defined on the wafer on which a photoresist film is formed, and a second region for exposing die areas adjacent to edge portions of the wafer using the light, the second region being disposed adjacent to the first region, a reticle stage for supporting the reticle, an illumination unit for illuminating the reticle using the light, a projection unit for projecting the light having passed through the reticle onto the wafer, and a wafer stage for supporting the wafer.

In another exemplary embodiment of the present invention, an apparatus for exposing a wafer comprises a light source for generating a light, a reticle assembly including a reticle having a pattern for transferring an image onto a plurality of shot areas using the light, each of the plurality of shot areas including at least one die area defined on the wafer on which a photoresist film is formed, a light transmitting member including a light transmitting area for exposing die areas adjacent to an edge portion of the wafer using the light, the light transmitting member being disposed adjacent to the reticle, and a reticle stage for supporting the reticle and the light transmitting member, an illumination unit for illuminating the reticle and the light transmitting member using the light, a projection unit for projecting the light having passed through the reticle and the light transmitting member onto the wafer, and a wafer stage for supporting the wafer.

These and other exemplary embodiments, aspects, features and advantages of the invention will become more apparent by describing in detail exemplary embodiments thereof with reference to the attached drawings.

DESCRIPTION OF EXEMPLARY EMBODIMENTS

Exemplary embodiments of the present invention now will be described more fully hereinafter with reference to the accompanying drawings. Embodiments of the invention may, however, be embodied in many different forms and should not be construed as limited to the exemplary embodiments set forth herein. Rather, exemplary embodiments are provided so that this disclosure will be through and complete, and will fully convey the scope of the invention to those skilled in the art.

Figure 1:
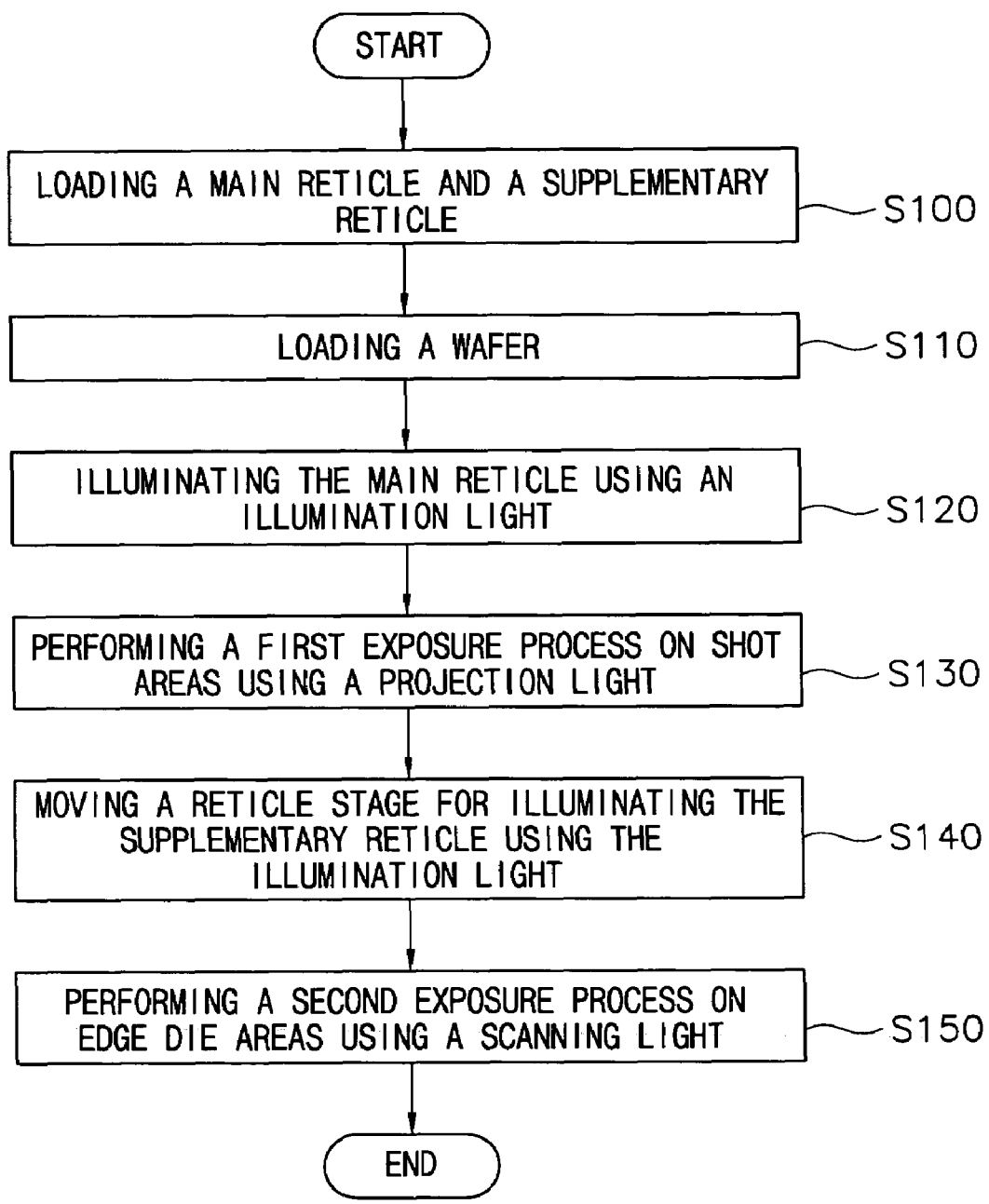
FIG. 1 is a flow chart for showing a method of exposing a wafer to a light according to an exemplary embodiment of the present invention.
Figure 2:
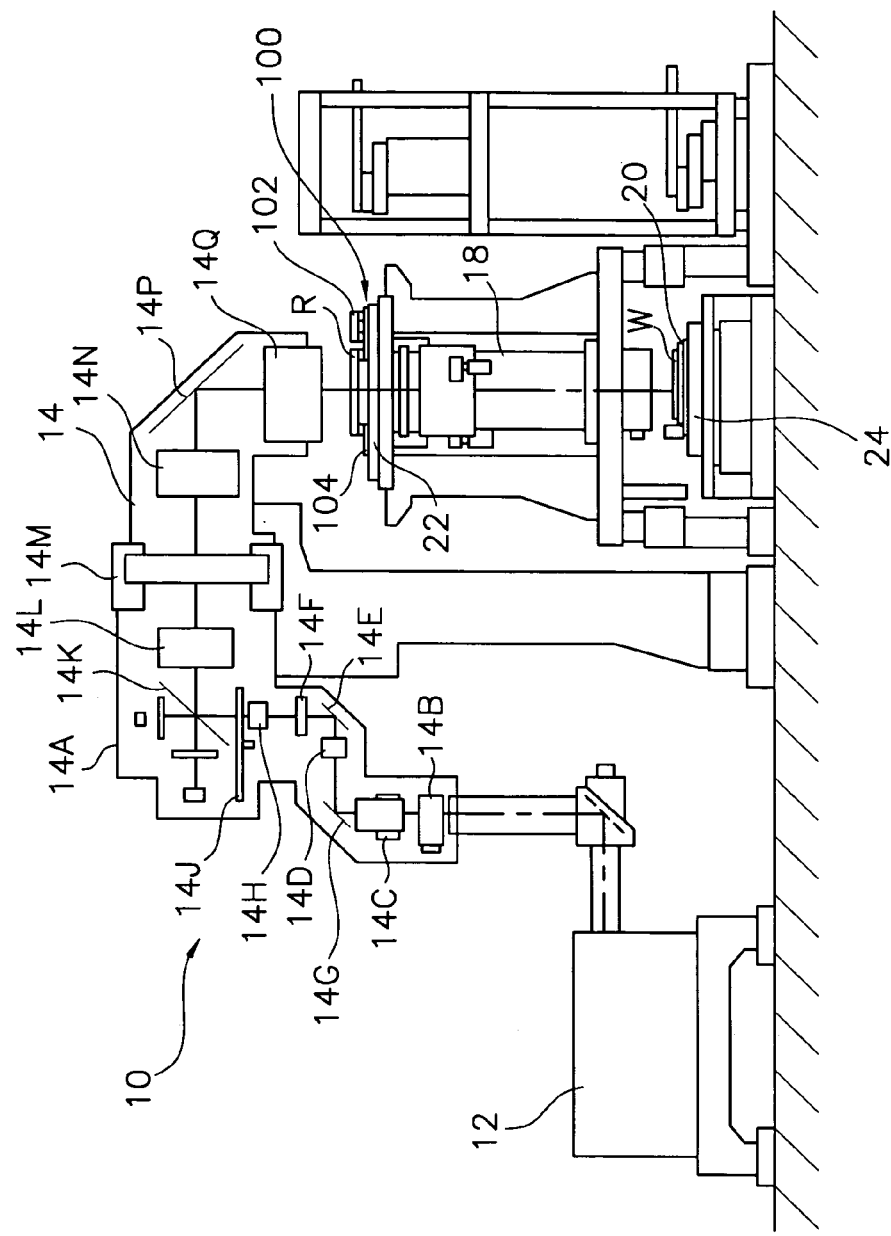
FIG. 2 is a structural view schematically illustrating an exposing apparatus for performing the exposing method shown in FIG. 1.

FIG. 1 is a flow chart for showing a method of exposing a wafer to a light according to an exemplary embodiment of the present invention. FIG. 2 is a structural view schematically illustrating an exposing apparatus for performing the exposing method shown in FIG. 1.

Referring to FIGS. 1 and 2, a photoresist film (not shown) is coated on a silicon wafer W, and the photoresist film is formed into a photoresist pattern by an exposing and a development process. The photoresist film is formed on the wafer W by a photoresist coating process and a soft baking process. The photoresist pattern may be used as an etching mask or an ion implantation mask.

A plurality of shot areas are defined on the wafer W. Each of the plurality of shot areas may include at least one die area. A size of the die area may be determined in accordance with a kind of the semiconductor device. A quantity and a size of each shot area may be determined in accordance with the size of the die area.

An exposing apparatus 10 according to an exemplary embodiment of the present invention includes a light source 12 for generating an illumination light, a reticle assembly 100, an illumination unit 14 for illuminating a reticle R using the illumination light, a projection unit 18 for projecting the illumination light having passed through the reticle R on the wafer, and a wafer stage 20 for supporting the wafer W. Hereinafter, a light having passed through the reticle R is referred to as a projection light. The reticle assembly 100 includes the reticle R, a light transmitting member 102, and a reticle stage 104. The reticle R has a first image pattern (or a projection pattern) corresponding to a photoresist pattern. The light transmitting member 102 has a light transmitting area that is shaped into a rectangular ribbon. The reticle stage 104 supports the reticle R and the light transmitting member 102.

A first image pattern of the reticle R is similar to an image to be transferred on the wafer W. The image corresponds to the photoresist pattern. That is, the illumination light passing the reticle R is converted into the projection light containing image information by the reticle R.

The light transmitting member 102 is disposed adjacent to the reticle R. The light transmitting member 102 has a second image pattern for converting the illumination light into a scanning light. The scanning light may have a cross sectional surface that is shaped as a rectangular ribbon. The second image pattern has a rectangular shape containing the light transmitting area that is shaped into the rectangular ribbon. The light transmitting member 102 is used as a supplementary reticle for exposing the die area adjacent to an edge portion of the wafer W.

An eximer laser emitting eximer laser beams may be used as the light source 12. For example, a krypton fluoride (KrF) laser, an argon fluoride (ArF) laser and a fluorine (F2) laser may be used as the light source 12. The krypton fluoride (KrF) laser emits a krypton fluoride laser beam having a wavelength of 248 nm. The argon fluoride (ArF) laser emits an argon fluoride laser beam having a wavelength of 193 nm. The fluorine (F2) laser emits a fluorine laser beam having a wavelength of 157 nm.

The light source 12 is connected with the illumination unit 14 through a beam matching unit. The illumination light generated from the light source 12 irradiates the reticle R or irradiates the light transmitting member 102 through the illumination unit 14. The illumination light having passed through the illumination unit 14 has a cross sectional surface that is shaped into the rectangular ribbon.

In an exemplary embodiment, the illumination unit 14 includes an illumination system housing 14A for sealing the inside thereof from surroundings, a variable beam attenuator 14B, a beam shaping optical system 14C, a first fly-eye lens system 14D, a vibrating mirror 14E, a condenser lens 14F, a first mirror 14G, a second fly-eye lens system 14H, an aperture stop plate 14J, a beam splitter 14K, a first relay lens 14L, a reticle blind mechanism 14M, a second relay lens 14N, a second mirror 14P, and a main condenser lens system 14Q.

The exposing apparatus 10 further includes a first driving unit 22 for moving the reticle stage 104 in a horizontal direction, and a second driving unit 24 for moving the wafer stage 20 in a horizontal direction.

When the exposing process is performed on the plurality of shot areas, the first driving unit 22 moves the reticle stage 104 in the horizontal direction to convert the illumination light passing the reticle R into the projection light containing image information. The second driving unit 24 may simultaneously move the wafer stage 20 in an opposite direction to the reticle stage 104. In another exemplary embodiment, the reticle stage 104 moves in a direction perpendicular to both a light axis of the illumination light and a longitudinal direction of a cross sectional surface of the illumination light. The wafer stage 20 may move in a direction perpendicular to both a light axis of the projection light and a longitudinal direction of a cross sectional surface of the projection light. The wafer stage 20 may move in an opposite direction to the reticle stage 104.

When the exposing process is performed on the die areas adjacent to the edge portion of the wafer W, the illumination unit 14 irradiates the light transmitting member 102 with the illumination light. The scanning light having passed through the second image pattern of the light transmitting member 102 has a cross sectional surface that is shaped into the rectangular ribbon. According to an exemplary embodiment, a size of the light transmitting area of the second image pattern is smaller than the cross sectional surface of the illumination light from the illumination unit 14. The second driving unit 24 moves the wafer stage 20 in a direction perpendicular to both a light axis of the scanning light and a longitudinal direction of a cross sectional surface of the scanning light. As a result, the scanning light may irradiates each of the die areas adjacent to the edge portion of the wafer W.

To control positions of the reticle R and the light transmitting member 102, the first driving unit 22 may move the reticle stage 104 in a horizontal direction perpendicular to the moving direction of the reticle stage 104, which corresponds to the longitudinal direction of a cross sectional surface of the illumination light. The first driving unit may rotate with respect to with a central axis of the reticle R. To control position of the wafer, the second driving unit 24 may move the wafer stage 20 in a horizontal direction perpendicular to the moving direction of the wafer stage 20, which corresponds to the longitudinal direction of a cross sectional surface of the projection light or the scanning light. The wafer stage 20 may rotate with respect to with a central axis of the wafer W.

Figure 3:
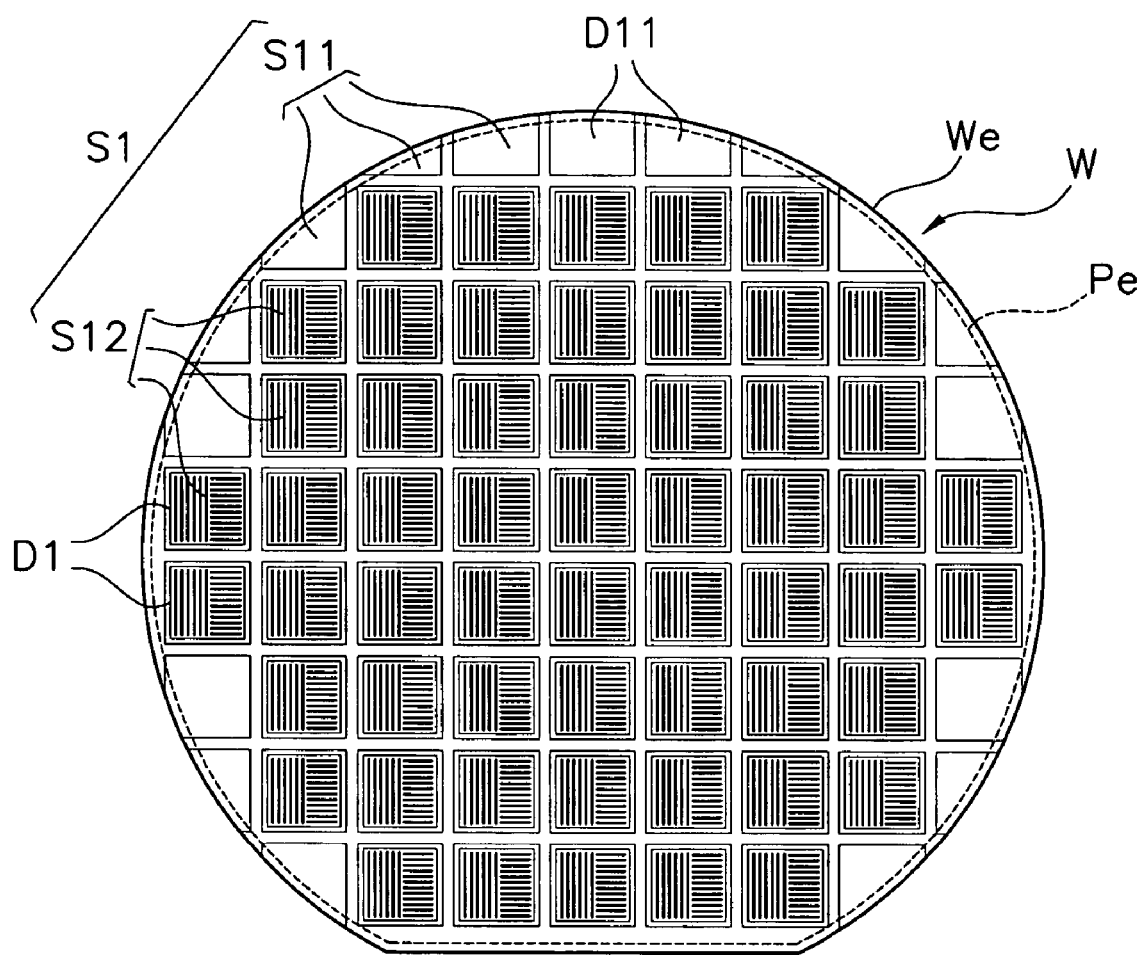
FIG. 3 is a plan view illustrating a wafer having a shot area substantially identical to a die area.
Figure 4:
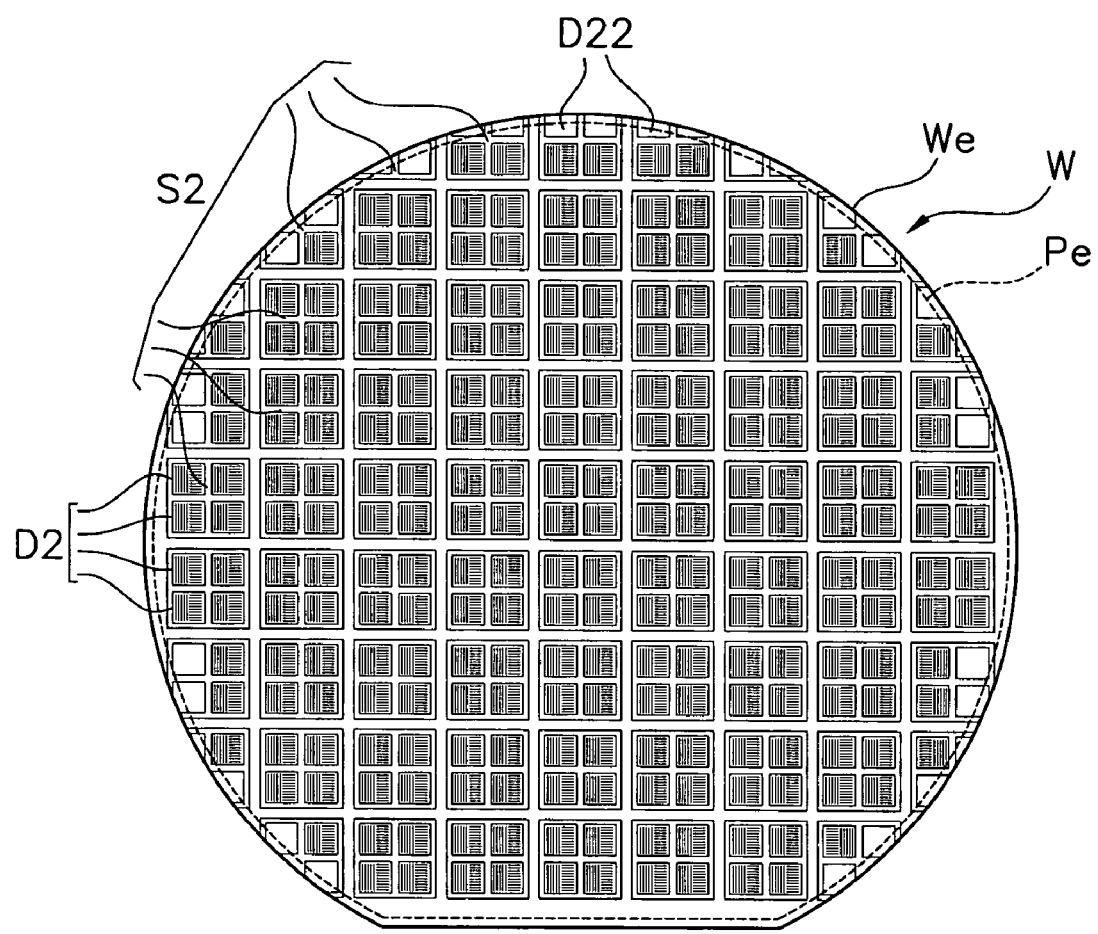
FIG. 4 is a plan view illustrating a wafer having a shot area including a plurality of die areas.

FIG. 3 is a plan view illustrating a wafer having a shot area substantially identical to the die area. FIG. 4 is a plan view illustrating a wafer having a shot area including a plurality of the die areas.

Hereinafter, a method of exposing a wafer to a light according to an exemplary embodiment of the present invention is described with reference to the above figures. The reticle R and the light transmitting member 102 are loaded on the reticle stage 104 (step S100). A wafer W is loaded on the wafer stage 20 (step S110). In an exemplary embodiment, the wafer W includes a plurality of shot areas S1 or S2 defined thereon. Each of the shot areas S1 or S2 has at least one die area D1 or D2. The illumination light generated from the light source 12 irradiates the reticle R after passing through the illumination unit 14 (step S120).

A first exposing process may be performed on the plurality of the shot areas S1 or S2 using the projection light having passed through the reticle R (step S130). The reticle stage 104 and the wafer stage 20 may move in an opposite direction to each other to transfer the first image pattern on each shot area S1 or S2. After the first exposing process on the plurality of the shot areas S1 or S2, the first driving unit 22 may move the reticle stage 104 and the illumination light from the illumination unit 14 irradiates the light transmitting member 102 (step S140).

A second exposing process may be performed on edge die areas D11 or D22 adjacent to the edge portion We of the wafer W. The second exposing process uses the scanning light having passed through the light transmitting area of the light transmitting member (step S150). During the second exposing process, the reticle stage 104 may be stopped and the wafer stage 20 may move in a direction perpendicular to the light axis of the scanning light by the second driving unit 24. The photoresist film on the edge die areas D11 or D22 can be removed during the second exposure process.

As shown in FIG. 3, when each of shot areas is substantially identical to each of die areas, the first exposing process is performed on non-edge shot areas S12, and the second exposing process is performed on the edge shot areas S11 or the die areas D11 adjacent to the edge portion $W_e$ of the wafer W.

As shown in FIG. 4, when each of the shot areas includes a plurality of die areas, the first exposing process may be performed on a whole shot area S2 on the wafer W. The second exposing process is performed on the die areas D22 adjacent to the edge portion $W_e$ of the wafer W. In an exemplary embodiment, the edge portion $W_e$ of the wafer W includes an edge portion $P_e$ of the photoresist film.

Since the first exposing process is performed using the reticle R, and the second exposing process is performed using the light transmitting member adjacent to the reticle R, the whole shot area on the wafer can be exposed without changing the reticle R. The size of the first pattern area of the reticle R is larger than the pattern area of the conventional reticle for the multiple exposure process. Thus, exposing time can be reduced.

Figure 5:
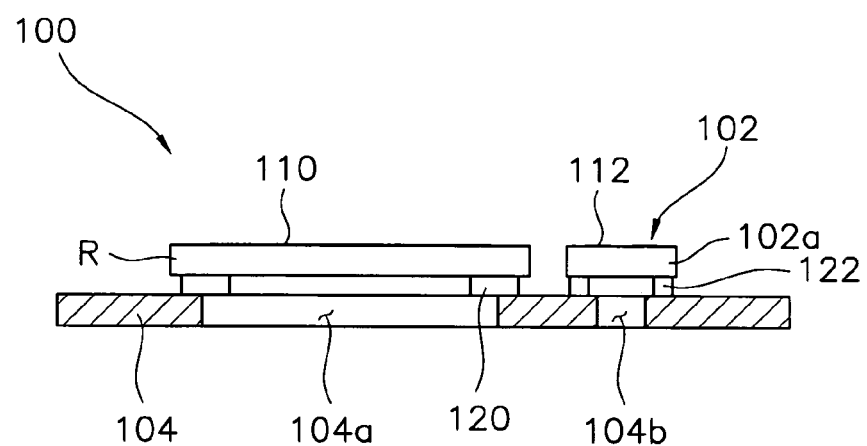
FIG. 5 is a cross sectional view illustrating a reticle assembly according to an exemplary embodiment of the present invention.
Figure 6:
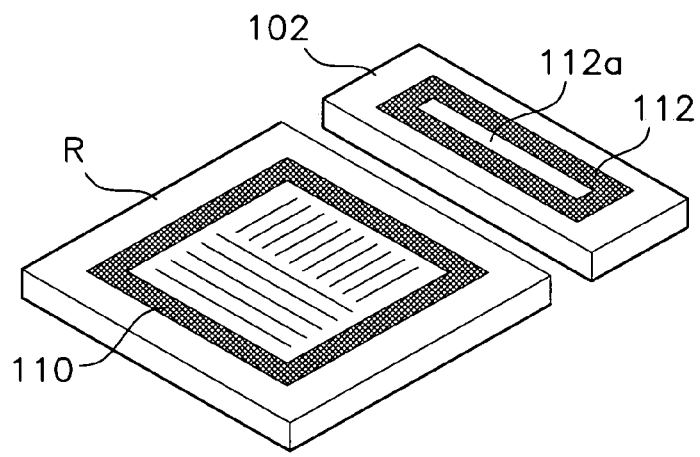
FIG. 6 is a perspective view illustrating the reticle and the light transmitting member shown in FIG. 5.
Figure 7:
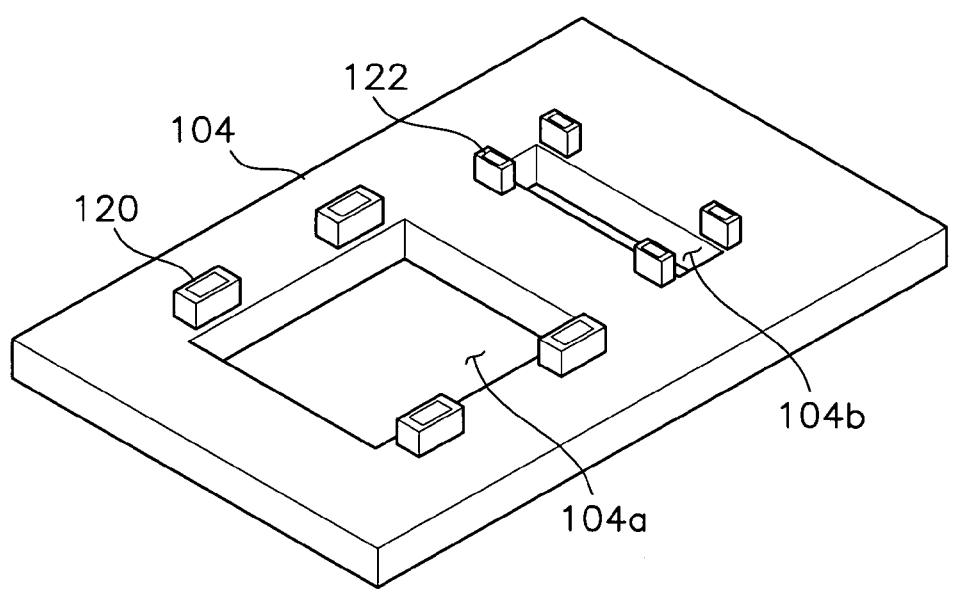
FIG. 7 is a perspective view illustrating the reticle stage shown in FIG. 5.
Figure 8:
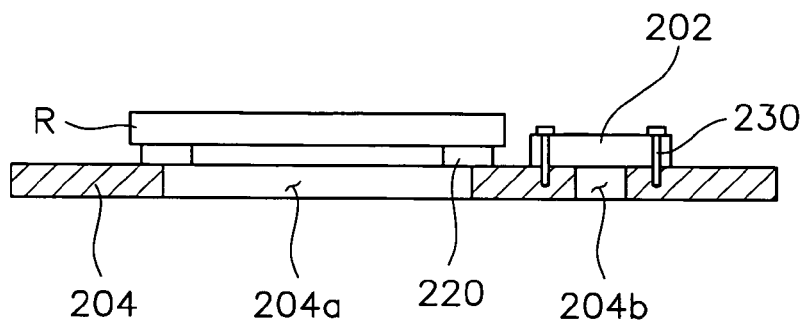
FIG. 8 is a cross sectional view illustrating a reticle assembly according to another exemplary embodiment of the present invention.

FIG. 5 is a cross sectional view illustrating a reticle assembly according to an exemplary embodiment of the present invention. FIG. 6 is a perspective view illustrating the reticle and the light transmitting member shown in FIG. 5. FIG. 7 is a perspective view illustrating the reticle stage shown in FIG. 5. FIG. 8 is a cross sectional view illustrating the reticle assembly according to another exemplary embodiment of the present invention.

Referring to FIGS. 5 through 8, the reticle assembly 100 includes a reticle R, a light transmitting member 102, and a reticle stage 104. The reticle R transfers an image onto a plurality of shot areas defined on a wafer W on which a photoresist film is formed using an illumination light passing through the illumination unit 14. The light transmitting member 102 exposes die areas adjacent to the edge portion of the wafer W to the illumination light. The reticle stage 104 supports the reticle R and the light transmitting member 102.

The reticle R includes a first image pattern 110 corresponding to a photoresist pattern. Each of the shot areas defined on the wafer W includes at least one die area. The light transmitting member 102 is disposed adjacent to the reticle R. The light transmitting member 102 has a structure similar to the structure of the reticle R. The light transmitting member 102 includes a rectangular substrate 102a, a second image pattern 112, and a light transmitting area 112a. The rectangular substrate 102a may be made from a light transmitting material. The second image pattern 112 is disposed on the substrate 102a and forms a light transmitting area 112a of a rectangular ribbon shape.

In an exemplary embodiment, the reticle stage 104 is a rectangular plate. The reticle stage 104 includes a main opening 104a through which the projection light passes after having passed through the reticle R. The reticle stage further includes a subsidiary opening 104b through which the scanning light passes after having passed through the light transmitting member 102. A plurality of first holders 120 for holding the reticle R using a vacuum is disposed around a peripheral portion of the main opening 104a. A plurality of second holders 122 for holding the light transmitting member 102 using a vacuum is disposed around a peripheral portion of the subsidiary opening 104b.

In another exemplary embodiment of the present invention, the light transmitting member 102 may be alternatively engaged with a peripheral portion of the subsidiary opening for covering the subsidiary opening as shown in FIG. 8. Referring to FIG. 8, the reticle R is held by the reticle holders 220. The reticle R covers the main opening 204a of the reticle stage 204. The light transmitting member 202 is mounted on the peripheral portion of the subsidiary opening 204b using a joint member 230 such as, for example, a bolt. The light transmitting member 202 may also be adhered to the reticle stage 204 using adhesives.

Figure 9:
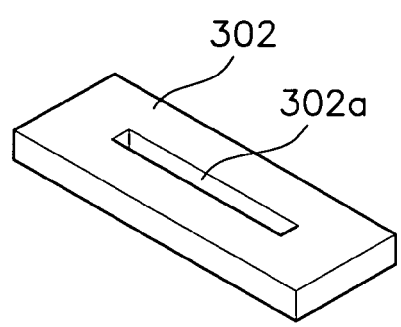
FIG. 9 is a perspective view illustrating a light transmitting member according to another exemplary embodiment of the present invention.

FIG. 9 is a perspective view illustrating a light transmitting member according to another exemplary embodiment of the present invention. Referring to FIG. 9, the light transmitting member 302 is a rectangular plate. The illumination light from the illumination unit 14 penetrates the light transmitting member 302 through a slot 302a. The light transmitting member 302 may be held by the second holders shown in FIG. 7. Alternatively, the light transmitting member 302 may be engaged with the reticle stage shown in FIG. 8 using the joint member shown in FIG. 8 or adhesives.

The slot 302a through which the illumination light passes may penetrate the reticle stage. In an exemplary embodiment, a cross sectional surface of the slot is smaller than that of the illumination light from the illumination unit 14.

Figure 10:
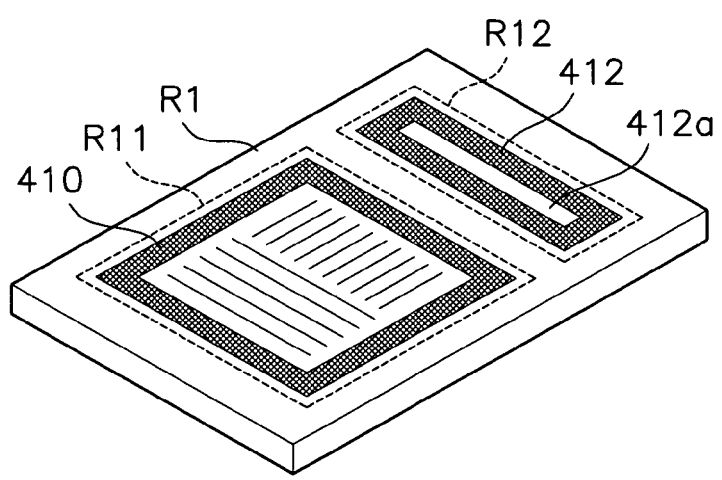
FIG. 10 is a perspective view illustrating another exemplary embodiment of the reticle.
Figure 11:
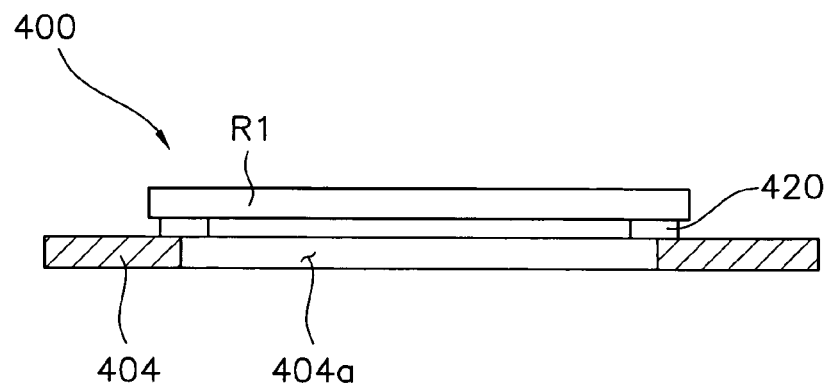
FIG. 11 is a cross sectional view illustrating a reticle assembly including the reticle shown in FIG. 10.
Figure 12:
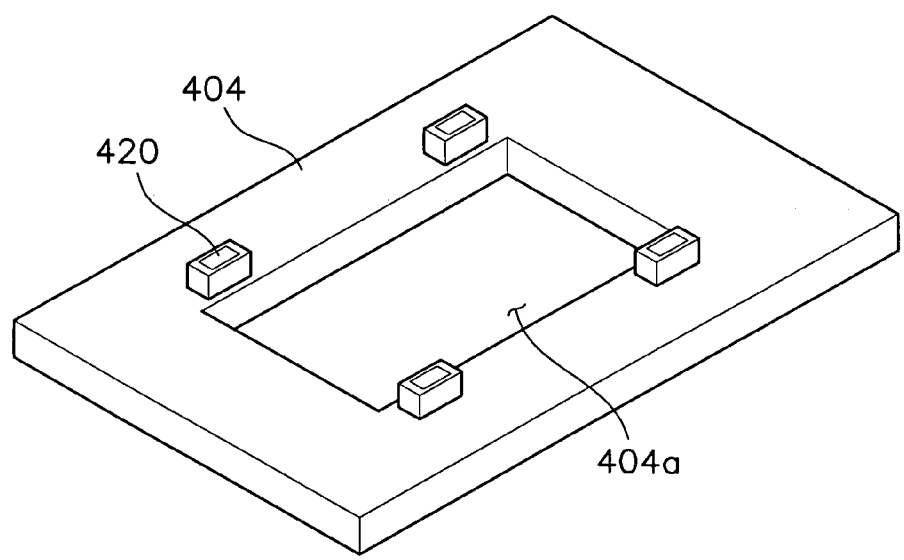
FIG. 12 is a perspective view illustrating a reticle stage shown in FIG. 11.

FIG. 10 is a perspective view illustrating the reticle R for performing the exposing method shown in FIG. 1 according to another exemplary embodiment of the present invention. FIG. 11 is a cross sectional view illustrating a reticle assembly including the reticle shown in FIG. 10. FIG. 12 is a perspective view illustrating a reticle stage shown in FIG. 11.

Referring to FIGS. 10 through 12, the reticle assembly 400 includes a reticle R1 for performing an exposing process on a wafer W and a reticle stage 404 for supporting the reticle R1. In an exemplary embodiment, the reticle R1 may be made from a light transmitting material and has a rectangular plate. The reticle R1 includes a first region R11 on which a first image pattern 410 is formed and a second region R12 on which a second image pattern 412 is formed.

The first pattern 410 can be used as a projection pattern for transferring an image onto a plurality of shot areas on the wafer W using an illumination light. Each shot area includes at least one die area defined on the wafer W on which a photoresist film is formed. The second pattern 412 can be used as a scan pattern for exposing an edge die area adjacent to an edge portion of the wafer W to the illumination light.

The second image pattern 412 includes a light transmitting area 412a of a rectangular ribbon shape for scanning the edge die area adjacent to the edge portion of the wafer W. The wafer W moves in a direction perpendicular to a longitudinal direction of the light transmitting area 412a. The scanning light irradiates the edge die area of the wafer W.

The reticle R1 is supported by the reticle stage 404. A plurality of holders 420 for holding the reticle R1 using a vacuum is disposed on the reticle stage 404. The reticle stage 404 includes an opening portion 404a through which the projection light and the scanning light pass. The projection light can be formed through the first image pattern 410 and the scanning light can be formed through the second image pattern 420. The reticle holders 420 are disposed around a peripheral portion of the opening portion 404a.

According to another exemplary embodiment of the present invention, the exposing method may include a first exposing process and a second exposing process. The first exposing process may be performed on a plurality of shot areas defined on the silicon wafer. The second exposing process may be performed on a plurality of die areas adjacent to an edge portion of the wafer. The first exposing process may be performed using a reticle having a first image pattern and the second exposing process may be performed using a light transmitting member adjacent to the reticle.

Accordingly, the exposing method can be continuously performed without changing the reticle. Thus the exposing time can be reduced as compared with the conventional single exposing process. The exposing time can also be reduced as compared with the conventional multiple exposing process using a reticle having a multiple pattern area. As a result, the exposing method and apparatus for performing the same according to exemplary embodiments of the present invention may improve the throughput of the wafer in an exposure process.

Although exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of exposing a wafer to a light, comprising:
   transferring an image onto a plurality of shot areas in the wafer having photoresist thereon by irradiating the wafer with a projection light passing through a reticle, wherein each of the plurality of shot areas includes at least one die area; and
   scanning a die area adjacent to an edge portion of the wafer by irradiating the die area with a scanning light passing through a light transmitting member disposed adjacent to the reticle.

2. The method of claim 1, wherein the scanning light has a cross-sectional surface of a rectangular ribbon shape.

3. The method of claim 1, wherein transferring the image includes:
   irradiating a projection pattern corresponding to the image with an illumination light, the illumination light having a cross sectional surface of a rectangular ribbon shape;
   moving the projection pattern vertically with respect to a light axis of the illumination light, thereby forming the projection light; and
   moving the wafer simultaneously with the projection pattern in an opposite direction to the projection pattern, thereby forming the image on the plurality of shot areas.

4. The method of claim 1, wherein the wafer moves vertically with respect to a light axis of the scanning light, so that the die areas adjacent to the edge portion of the wafer is scanned by the scanning light.

5. The method of claim 1, wherein the image is transferred onto the plurality of shot areas except for edge shot areas adjacent to the edge portion of the wafer when each of the plurality of shot areas is substantially identical to each of die areas.

6. The method of claim 1, wherein the image is transferred onto a whole shot area when each of the plurality of shot areas includes a plurality of die areas.

7. The method of claim 1, wherein the edge portion of the wafer substantially includes an edge portion of the photoresist film.

8. A method of exposing a wafer to a light, comprising:
   irradiating a reticle having a projection pattern corresponding to an image to be transferred onto the wafer with an illumination light;
   exposing a plurality of shot areas to a projection light that has passed through the reticle, each of the plurality of shot areas including at least one die area defined on the wafer on which a photoresist film is formed;
   moving the reticle and a light transmitting member such that the illumination light illuminates the light transmitting member, the light transmitting member being disposed adjacent to the projection pattern and having a projection area; and
   moving the wafer such that a scanning light that has passed through the light transmitting member scans die areas adjacent to an edge portion of the wafer.

9. The method of claim 8, wherein the projection area is shaped into a ribbon.

10. The method of claim 8, wherein the reticle and the light transmitting member are supported by a stage including a main opening through which the projection light passes and a subsidiary opening through which the scanning light passes.

11. The method of claim 8, wherein the illumination light by which the reticle and the light transmitting member are illuminated has a cross-sectional surface of a rectangular ribbon shape.

12. The method of claim 8, wherein the reticle moves vertically with respect to the illumination light and the wafer moves in an opposite direction to the reticle to transfer the image corresponding to the projection pattern onto the wafer while the plurality of shot areas are exposed to the projection light.

13. The method of claim 8, wherein the plurality of shot areas are exposed to the projection light except for edge shot areas adjacent to the edge portion of the wafer when each of the plurality of shot areas is substantially identical to each of the die areas.

14. The method of claim 8, wherein the plurality of shot areas are wholly exposed to the projection light when each of the plurality of shot areas includes a plurality of die areas.

15. The method of claim 8, wherein the edge portion of the wafer substantially includes an edge portion of the photoresist film.

* * * * *